United States Patent [19]
McArdle

[11] Patent Number: 5,214,240
[45] Date of Patent: May 25, 1993

[54] HIGH VOLTAGE INSULATOR TESTING SYSTEM

[75] Inventor: Kevin McArdle, Norristown, Pa.
[73] Assignee: James G. Biddle Co., Blue Bell, Pa.
[21] Appl. No.: 747,796
[22] Filed: Aug. 19, 1991

Related U.S. Application Data

[62] Division of Ser. No. 564,136, Aug. 7, 1990, abandoned.
[51] Int. Cl.⁵ .......................................... H02G 15/28
[52] U.S. Cl. ............................ 174/11 BH; 174/15.1; 174/18
[58] Field of Search ............ 174/31 R, 17 LF, 152 R, 174/15.1, 15.3, 18, 15 BH, DIG. 10, 11 BH

[56] References Cited

U.S. PATENT DOCUMENTS

| | | | |
|---|---|---|---|
| 2,647,939 | 8/1953 | Paluev | 174/15 BH |
| 3,576,386 | 1/1969 | Moisson-Franckhauser | 174/18 |
| 3,634,798 | 3/1970 | Astleford | 174/17 LF X |
| 4,214,118 | 9/1976 | Gray | 174/15 BH X |

*Primary Examiner*—Leo P. Picard
*Assistant Examiner*—Trinidad Korka
*Attorney, Agent, or Firm*—Dann, Dorfman, Herrell and Skillman

[57] ABSTRACT

A corrona test set has at least a reactor and power separation filter placed in an oil-filled conductive tank of a conductive material such as sheet steel. The exciter optionally may also be placed in the same tank enclosure which is of much smaller size than the equivalent voltage rating test set in air. High voltage taken from the circuit passes out of the tank through high voltage bushings. A preferred form of bushing is a quick coupling cable receiving device having an insulator extending into the tank and a frustoconical metallic extension extending away from the tank with a tubular internal wall connected to these respective parts at opposite ends to form a further oil-filled compartment separate from the tank. A temporary cable termination may be applied to a cable which enables a tubular outer piece to supply rigidity and guidance within the tubular inner wall of the bushing to facilitate contact between the bushing high voltage conductor at the insulator at the tank end of the bushing and the coaxial conductor within the cable. A clamping and sealing ring is provided to hold the terminated cable in position so the demineralized and deionized water can be circulated through the entire space between the cable itself and the inner wall of the oil-filled bushing compartment.

6 Claims, 8 Drawing Sheets

HIGH VOLTAGE INSULATOR TESTING SYSTEM

This is a division of co-pending application Ser. No. 564,136 filed Aug. 7, 1990 is now abandoned.

The present invention relates to a system for testing insulators, and particularly for testing cables, for high voltage on the order of 60 KV through 800 KV. This system is much reduced in size over prior art systems and offers great facility in cable connection and removal so that the cables may be pre-prepared in advance and one test after another may be run in succession with a minimum amount of time for changing from one reel to another.

THE STATE OF THE ART IN CABLE TESTING

In order to test power cables which must be used under high voltage conditions, at least the high voltage levels at which the cables will operate must be simulated, and in most cases it is desirable to exceed the level of normal use. In order to do this, it is common to use available line voltage to step up the voltage somewhat by means of a transformer and then use a resonant circuit including a variable core reactor and a suitable capacitance which may also be variable to produce the desired level of voltage. In most cases at least part of the capacitance required may be supplied by a power separation filter. High voltage cables are coaxial in construction with a center conductor covered with an extruded solid insulator that may be in multiple layers followed with a ground potential metal barrier and outer covering required to protect against mechanical abuse. High voltage cable to be tested is often kept on a reel which may contain several hundred feet of cable and it is necessary then to connect both ends of the cable on the reel to the test system. Termination of these high voltage cables may be made with stress cones that are hand wrapped and take many hours to fabricate or alternatively terminated with a system utilizing deionized water. A publication by Biddle Instruments, assignee of the rights herein, designated Bulletin 68A, deals with test systems of the prior art and pictures to some extent the equipment used. High voltage cable termination systems were also developed and employed water conditioners to remove minerals and provide deionized water on a circulating basis to surround the cable terminations. This Bulletin shows that the equipment used has been elaborate, very large in scale, required lengthy bushings and involved much work in setting up an individual test on a given reel of cable. Tests were commonly conducted in large shielded buildings to exclude electromagnetic interference originating outside of the test area. In order to perform the type of test offered by the system, it was necessary to have a building of the order of 2,000 to 3,000 square feet and 15 to 40 feet high. In addition, the bushings were large and stand-off insulators when required supporting the reactors from the ground might be several feet in height, particularly for second stage higher voltage reactors. In short, the testing systems were large and required an inordinant amount of space. The testing itself was tedious and took a long period of time for preparation of the cable termination between individual tests.

THE NATURE OF THE PRESENT INVENTION

The present invention is directed to an improvement in test sets for high voltage testing of cables, and other insulator samples, which test sets are capable of greatly reducing the amount of space required. They also enable pre-preparation of the cable terminations so that they are quickly plugged into the cable termination bushings and likewise quickly removed, so that little time is lost between tests.

More specifically, the concept is to place at least the highest voltage portions of the systems within oil in a completely shielded tank, such as a tank of steel. The systems and the circuits employed remain essentially the same, but because of the immersion in partial discharge suppressing insulating oil the size of bushings and cable connectors can be greatly reduced. Elaborate precautions involving the support of inductors on stand-off insulators, for example, are minimized and even in a two stage very high voltage test system, the second inductor need only be supported approximately a foot off the floor of the tank with relatively simple support insulators.

The present invention can be used in combination with prior art techniques so that a smaller tank including only part of the equipment can be used to partially reduce size of the space required for the test equipment. Conventional high voltage cable termination systems such as shown in Biddle Bulletin 66-14E may be employed provided they are placed in a shielded room and conventional bushings are used from the tank to output the high voltage to the cable termination systems.

More specifically the present invention relates to a high voltage system for insulator testing employing a conductive tank for completely enclosing selected components. Within the tank there would normally be at least the reactor and a power separation filter connected in circuit with the reactor. A coupling bushing through the tank is required for connecting an insulator to be tested in circuit with the reactor and power separation filter and through the tank wall. However, in preferred embodiments, the bushings themselves provide cable termination systems, thereby greatly reducing the size and complication of equipment while preserving the test efficacy and procedure.

The bushings themselves are novel and involve a insulator barrier wall extending into the tank from the sidewall of the tank surrounding an access opening in the tank wall. Through the insulator wall remote from the wall of the tank extends a conductive member to which the high voltage output of the components within the tank is coupled. A tapered frustoconical metallic extension conductively fixed to the tank wall around the opening extends the bushing housing begun by the insulator barrier wall away from the tank. Internally an insulator tube extends from a conductive metallic extension terminating structure to an outward extending flange on the conductor through the insulating wall. This internal tubular wall completes a further enclosure provided with the insulator barrier wall and the frustoconical metallic extension as a separate bushing compartment for oil. The internal tubular wall's cylindrical inner surface also serves as a guide to a pre-prepared cable termination.

In the cable termination structure an insulating tubular sleeve is ultimately provided around the cable termination to keep the cable end straight and rigid. To prepare for this sleeve the cable is first stripped of its outside conductive sheath back to a predetermined point determined by where the cable termination must be held relative to the bushing oil compartment. At that point the conductive sheath is affixed to a conductive terminating ring applied to the cable. A conductive clamping ring contacting the terminating ring extends radially outward from the cable and provides a clamping surface for holding the cable into the bushing as well as a support surface for the insulating tubular sleeve. Sealing means may be in the form of a ring mechanically integral with the clamping ring and fixed to the cable to provide a water-tight enclosure. The central conductor of the cable is also terminated in an electrical fitting cooperating with the bushing high voltage electrical conductor termination. A radially extending support supported on the central conductor electrical fitting provides support for the insulating tubular sleeve which surrounds the cable end and extends between the radial extension and the sealing ring. The cable tubular sleeve is designed to be rigid but is perforated to permit water circulation and supports guide means positioned periodically around the periphery to engage the inner surface of the bushing guide tube to direct the cable conductive termination into mating relationship with the conductive member in the bushing. Conductive contact for the grounded cable sheathing is established when the clamping ring abuts and is clamped to the metallic portion of the bushing. Water lines are provided through the bushing to the space between the bushing guide tube and the cable to supply demineralized, deionized water to this space. Circulating means and a heat exchanger attached to the water lines continually circulate the water.

THE DRAWINGS

For a better understanding of the present invention, reference is made to the accompanying drawings in which.

EXPLANATION OF THE SPECIFIC EMBODIMENTS OF THE PRESENT INVENTION

Figure 1:
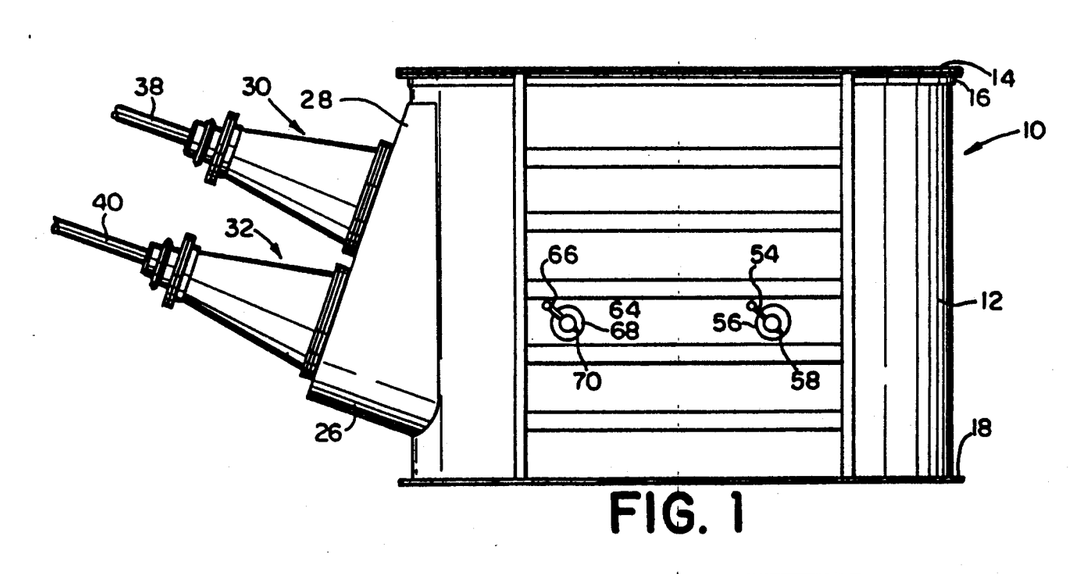
FIG. 1 is a side elevational view of the shielded housing and externally visible apparatus of the cable testing system of the parallel resonant type of the present invention.
Figure 2:
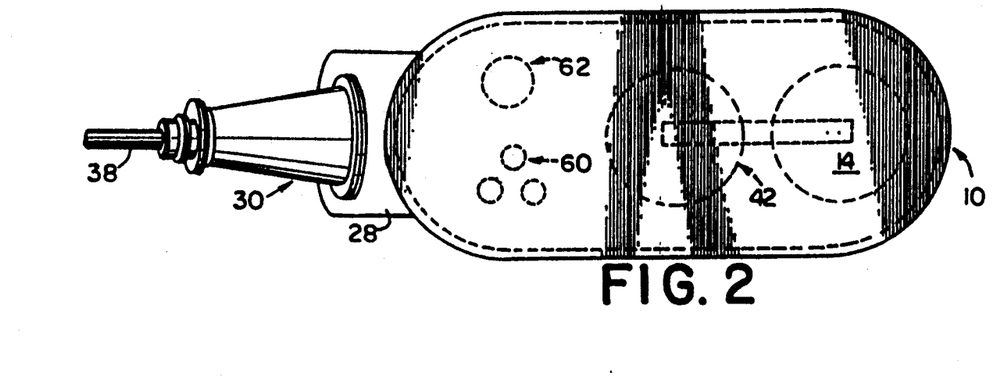
FIG. 2 is a plan elevational view from above of the structure of FIG. 1.
Figure 3:
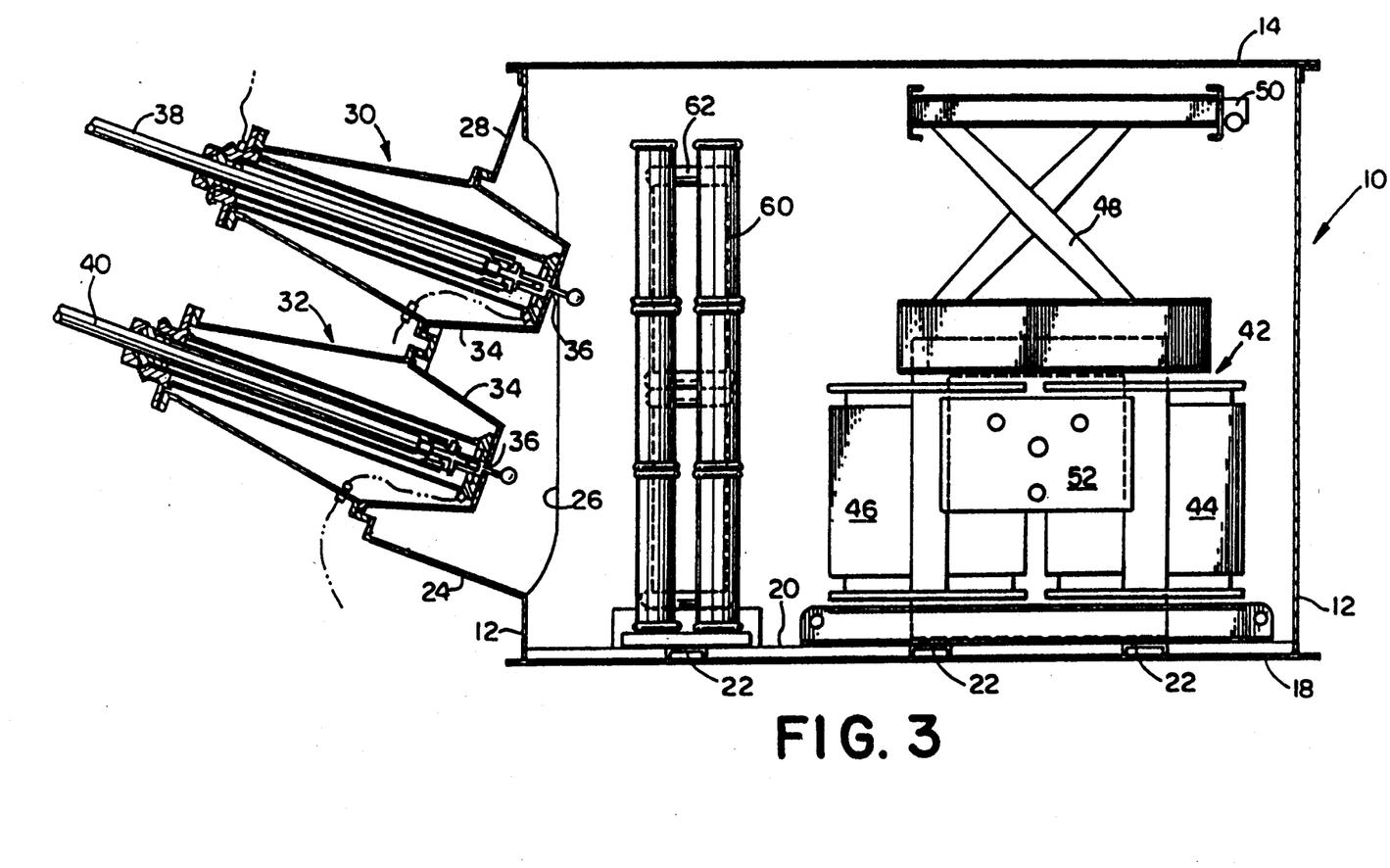
FIG. 3 is a somewhat enlarged sectional view taken through the housing and the bushings with cable termination means in place showing other internal apparatus in elevation.

Referring first to FIGS. 1 through 3, there is illustrated a high voltage cable testing system of the present invention which might have a 400 KV rating. A grounded metallic shielding tank generally designated 10 which may be made of sheet metal houses high voltage components. In this embodiment tank 10 comprises generally oval sidewalls 12, a flat top 14 and a bottom 18. The tank top 14 is so constructed that it may be easily removed from the sidewalls 12 to install or remove the enclosed component. To this end an angle iron flange 16 around the top of the tank 12 may be provided and welded to the tank to support the cover 14 and, if desired, permit it to be bolted in place. The bottom 18 is permanently welded to the sidewalls 12. Components may be supported on flooring 20 supported from the tank bottom 18 by spacers 22. At one end of the housing 10 the sidewall is provided with a housing extension 24 affixed to surround an opening 26 in the wall and supported in place by welding or otherwise. Extension 24 is provided with its own cover 28 through which extend high voltage bushings generally designated 30 and 32 and seen in greater detail in FIG. 7. Bushings 30 and 32 are essentially identical in structure and each respectively receives opposite ends of a cable to be tested typically wound and supported on a spool during testing. A generally circular hole is provided in cover 28 for each bushing. The oil in the tank is separated from oil in the bushings by frustoconical insulating terminations 34 of polypropylene or other suitable material through which extends a conductor 36 which provides a high voltage internal connection to the tank 10 for the center conductor of one of cable ends 38 and 40.

As seen in FIG. 3, internally the tank 10 contains a reactor, generally designated 42, which is preferably a parallel reactor having a split adjustable core of the type shown, for example, in U.S. Pat. No. 3,883,836 assigned to Biddle Instruments, or other suitable types. The reactor consists of parallel coils 44 and 46 which have legs of a U-shaped core extending part-way up into the reactor and the legs of inverted U-shaped core extending downward into the reactor toward the upward extending legs of the U-shaped reactor core. The more closely the core pieces are brought together the greater the reactance and this adjustable reactance is controlled by an adjusting mechanism generally designated 48 of various types known in the art. Adjusting mechanism 48 is driven by a worm gear on the shaft of gear box 50 from a motor (not shown), for example. A typical reactor is provided with a reactor tap switch 52, the insulator shaft for which extends through the housing 10, specifically sidewall 12, as seen in FIG. 1, and terminates in a rotatable handle 54. Handle 54 is used to select a particular tap using a calibrated dial 56 to which an indicating pointer 58 rotating with the handle points to adjust the reactor tap switch. Similarly within the housing 10 is provided a power separation filter 60 (PSF) and a high voltage filter 62, both of which are conventional capacitance devices. For adjustment of the power separation filter, a PSF tap switch 64 having an operating structure similar to the reactor tap switch 52 has a shaft extending through the housing sidewall 12. A manual adjustment handle 66 and a calibrated dial 68 to which pointer 70 points in various positions selected by handle 66 indicates the effective level of capacitance selected. The reactor and PSF tap switches 52 and 60 effectively select varying amounts of inductance and varying amounts of capacitance from the capacitor configuration for a combination producing resonant output when connected in a series circuit involving each of the elements of the test set. In addition to the PSF and the variable inductor, various components used in systems of the prior art may also optionally be included within the tank enclosure. For example, a noise filter 62 may commonly be employed.

It will be understood that a reactor using the parallel resonant technique works in combination with the PSF 60 to achieve a high voltage resonance effect. Consequently the input into the tank through the tank wall 12 of the output from an exciter outside of the tank or, if the exciter is included inside the tank, the input of the power lines to the exciter, does not require extraordinary bushings or more than routine insulation precautions in view of the relatively low voltage involved. Similarly the reactor tap switch 54 and the PSF tap switch handle 66, because they are effectively on the grounded side, can be mounted on the housing wall 12 without precautions being taken for high voltage. On the contrary, however, special high voltage bushings 30 and 32 are required for the test connections to the cable ends 38 and 40, since this is a position in which the highest potential is involved.

Figure 4:
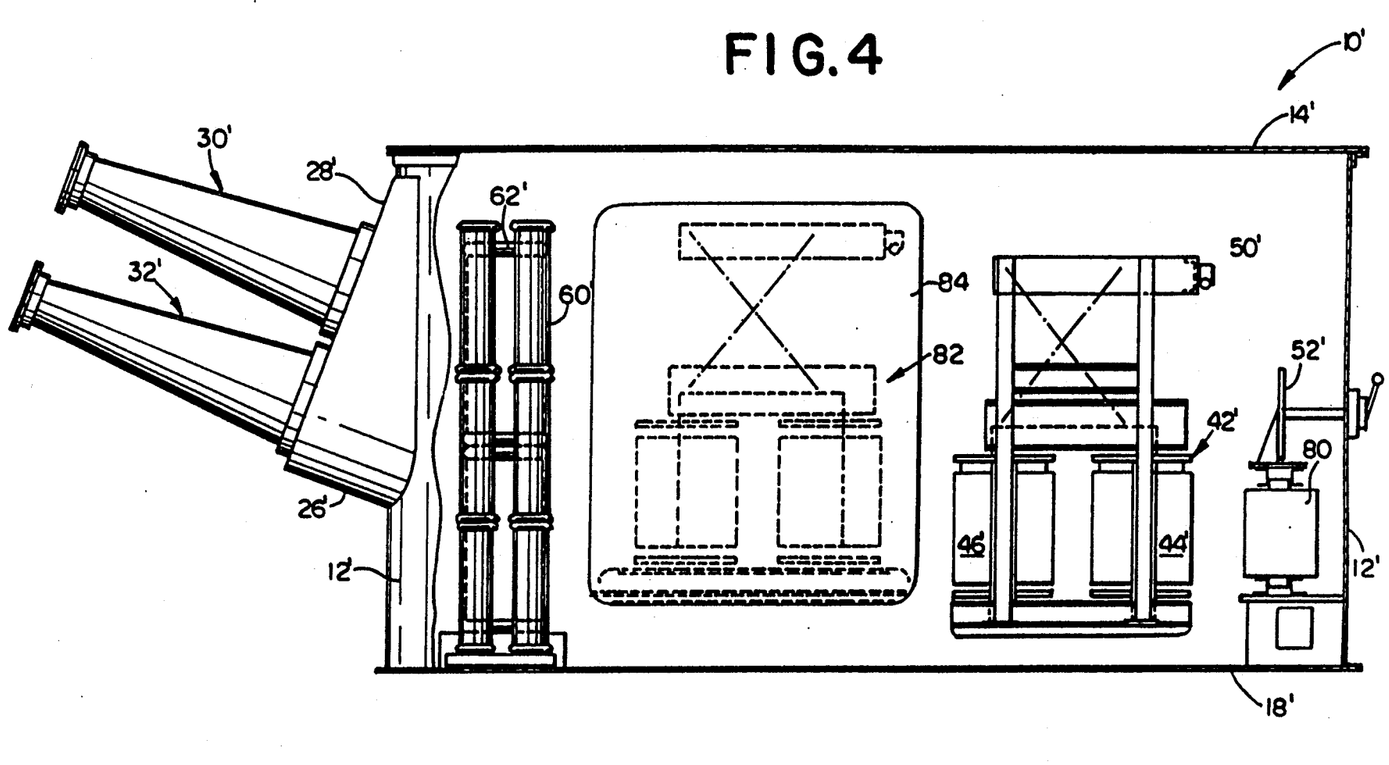
FIG. 4 is a partial sectional view on the scale of FIG. 1 of a larger, higher voltage system of the series resonant type in accordance with the present invention showing internal system components in elevation.
Figure 5:
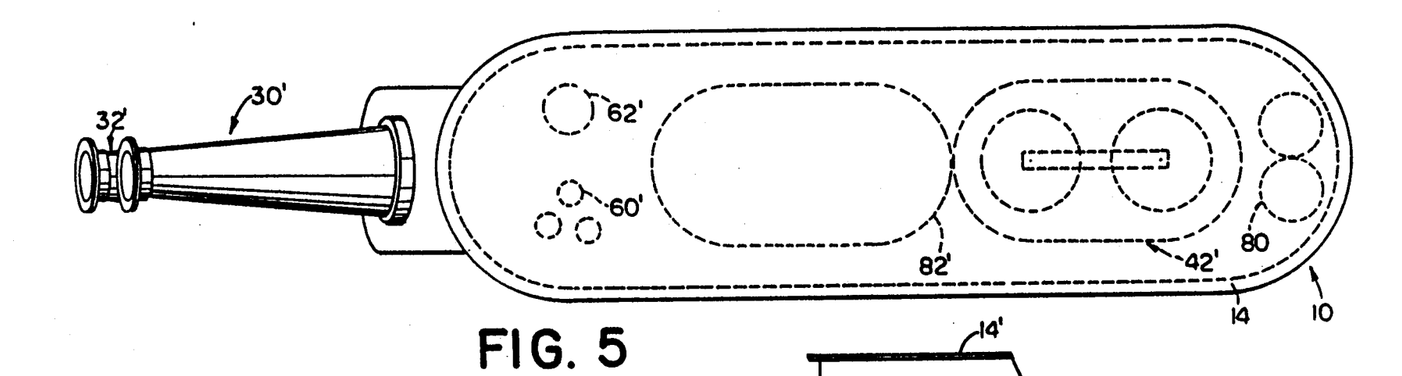
FIG. 5 is a plan view from above of the system of FIG. 4.
Figure 6:
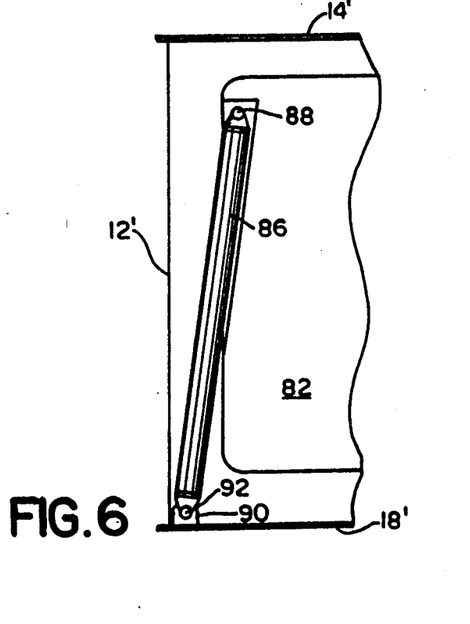
FIG. 6 is a partial view showing a support insulator arrangement for first and second stage variable inductors of the apparatus shown in FIG. 4.

FIGS. 4, 5 and 6 show a modified cable testing system in which higher potentials that might be on the order of 800 KV are employed. Similar elements are employed in the system and designated by similar number designators with the additions of primes thereto. The difference in this case is an exciter 80, which is normally a first stage voltage elevating transformer enclosed within the tank 10'. It will be understood that the exciter and the other components are connected in the series resonant technique with the cable under test introduced through the cable bushings 30' and 32'. The tap switch 52' may be taken through one end of the sidewalls 12' instead of the side. The major change is in the size of the tank to accommodate additional equipment which may or may not include the exciter, but may include additional series type variable reactors, generally designated 82, but which will be understood to be preferably the same design as the first stage 42'. The difference is that, because of the elevated voltage, a separate internal housing or shield 84 is provided to enclose the reactor 82. Like the outer tank, the inner tank is filled with oil, but instead of being grounded, the shield, which may be made of sheet steel like the outer tank, is placed at a portion of the voltage imposed on the cable termination in a typical situation in designing the system. Since the shielded housing 84 is at elevated voltage, it is also spaced evenly away from the top 14' and the bottom 18' of larger tank 10'. This may be accomplished using special support insulators as shown in FIG. 6. The support insulator 86 is attached near the top of the shield 84 by a suitable fastener means 88 and to suitable brackets 90 supplied on the bottom 18' or structure supported from the bottom of the main tank 10' by fastening means 92. The support insulator itself is of any suitable insulator material capable of holding off the high pressure and also voltage stress. The typical housing illustrated stands ten feet high with sufficient separation between the top and bottom of the shield from the top and bottom of the tank. The PSF 60' and the high voltage filter 62' may be spaced further from the outside tank 10' using suitable insulation means.

Figure 7:
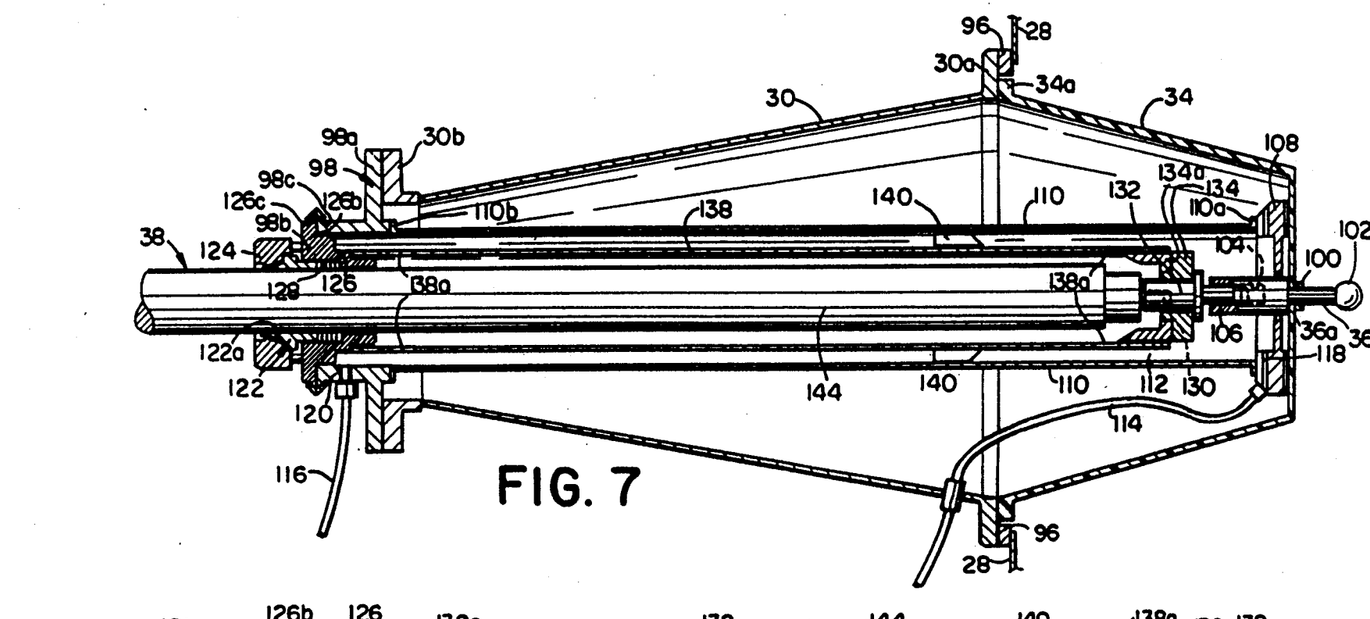
FIG. 7 is a further enlarged sectional view similar to that seen in FIG. 3 of the cable receptacles of the bushings showing a cable in place for testing.

FIG. 7 shows the detail of the internal construction of the high voltage bushing employed in FIGS. 1 to 3, it being understood that the bushings employed in the structure of FIGS. 4 and 5 may be modified in size to accommodate the higher voltage, but the concept remains the same. The steel shell at the tank is continued in frustoconical portion 30 of the bushing external of the tank. Preferably this frustoconical portion 30 has flanges 30a at the wall 28 and 30b at the cable entry end of the structure. Both sets of flanges are out-turned. Flange 30a cooperates with a ring 96 welded to the wall 28 of tank 12 and to which flange 30a may, in turn, be welded. Flange 30b supports a termination ring 98 by which out-turned flange 98a is welded or otherwise suitably fixed to flange 30b.

Extending inwardly into the tank is the frustoconical cup-shaped insulator member 34. Member 34 is composed of polypropylene or other appropriate insulating material having necessary strength and mechanical properties as well and is sealed to the flange 30a within ring 96 by suitable means through its flange 34a. Through the bottom of the cup 34 extends the high voltage connection conductor 36 which is appropriately fixed within the cup using a shoulder 36a at the reduced diameter portion which snugly passes through a hole in the bottom and is engaged by a small sealing ring 100 outside the cup to make an oil tight seal. Internally of the tank 10 a suitable connector 102 to a high voltage line from the components inside the tank is provided. The connector 36 has an axial bore to snugly receive a prong or bayonet terminal 106 connected to the axial conductor of the cable 38 affixed to the high voltage connection. Connector 36 also supports a ring 108, a thickened outer edge of which provides a flat annular surface. Tube 110 of insulating material may be sealed by an end flange 110a to the ring 108. A similar end flange 110b at the other end of tube 110 is sealed against flange 98a of ring 98 thereby providing an interior oil compartment bounded by tube 110, ring 108, high voltage connection 36, insulating cup 34, tapered steel cone 30 and ring 98. This separate bushing oil fills the entire space including the small recess between the bottom of the cup 34 and the ring 108. This compartment is filled with oil which is kept separate from the oil inside the tank and which may be the same type or a different kind of oil, but is isolated so that a small volume of oil can be readily changed in case it is contaminated by water, for example. Within the tube 110 and surrounding the cable 130 is a water jacket 112 which is supplied by water lines 114 and 116 to a circulating conditioner which keeps water in the compartment continually changing and cooled as well as filtered. The lines 114 and 116 are fed through suitable fittings and ducts 118 and 120, respectively in end rings 108 and 98, to the interior of the water jacket 112. Thus the entire space within each bushing is filled, partially by oil and partially by water so that no interior bushing space is occupied by air.

Figure 8:
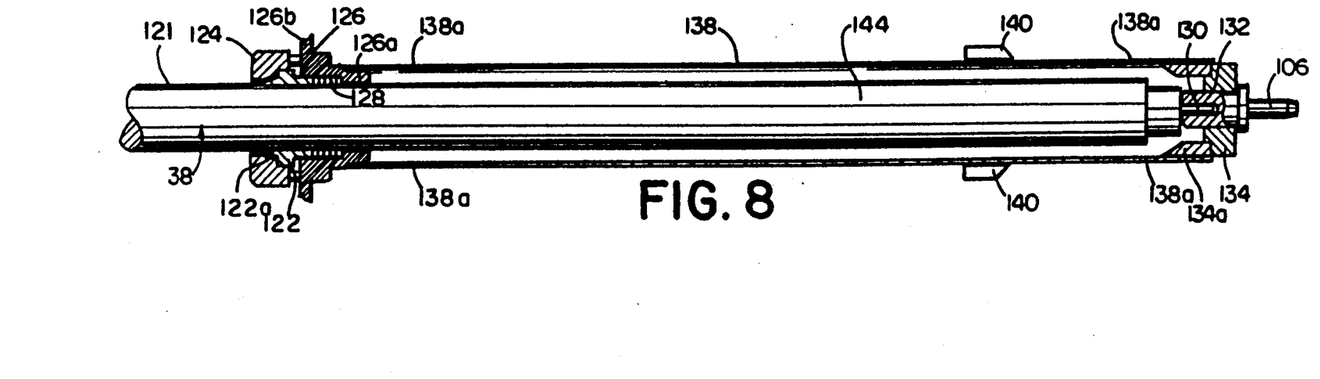
FIG. 8 shows the end of a cable prepared in accordance with the present invention for introduction into a bushing cable receptacle.

The cable 38 itself has its ends specially prepared for quick coupling to the test set. Reference to FIG. 8, as well as FIG. 7, will facilitate an understanding of the structure involved. The cable 38 has an outer woven or braided conductor cover 121 which is intended to be grounded and in this case is removed back to a termination ring 122 snugly fitting over the cable and providing a beveled surface 122a to which the cable cover 121 is fixed. This piece interfits with finishing ring 124 which has an oppositely arranged and conforming interior surface to cooperate with ground connection 122. Also fitted snugly onto the cable is the combination packing and ground connection ring 126. Ring 126 has a small diameter portion 126a which fits snugly over the cable with the outer conductor removed and part of the inner diameter of which is recessed to receive packing material 128 between it and the cable and is also such diameter as to snugly receive ring 122. An out-turned flange 126b, as seen in FIG. 7, has at its outer edge a ridge 126c. Ridge 126c cooperates with ridge 98c such that together they form an outwardly directed V-shaped peak enabling chevron-shaped, resilient split ring clamp 130 to be placed over them to hold them in place. The position of ring 126 is carefully selected such that it will abut guide ring 98b when the cable termination is fully inserted. At the extreme end of the cable the central coaxial conductor 130 is stripped of insulation and inserted into an axial recess in conductor 132 terminating in bayonet fitting 106 ultimately received in the axial bore 104 in the high voltage connection 36 as seen in FIG. 7. Around member 132 is support fitting 134 which carries flange 134a over which tubing member 138 is placed and secured. Tubing member 138 also fits over a reduced diameter portion of ground connection ring 126 and specifically the inner edge of its flange 126a. Tube 138 can be reused but is not intended to have extended life. Tube 138 is made of a thin lightweight and relatively rigid insulator which is perforated to allow water to fill the spaces on both of its sides. Tube 138 supports guides 140 periodically arranged around the tube 138 and slideably received within the cylinder 110 to guide the bayonet fitting 106 into its receptacle 104. Tube 138 is provided with periodic openings 138a to allow water inside water jacket tube 110 to enter the region surrounding the cable insulation 144. It will be observed that water will be fed under pressure into the entire region internal of tube 110. Water will fill that region 112 and will enter the openings 138a and fill the regions within tube 138.

Figure 9:
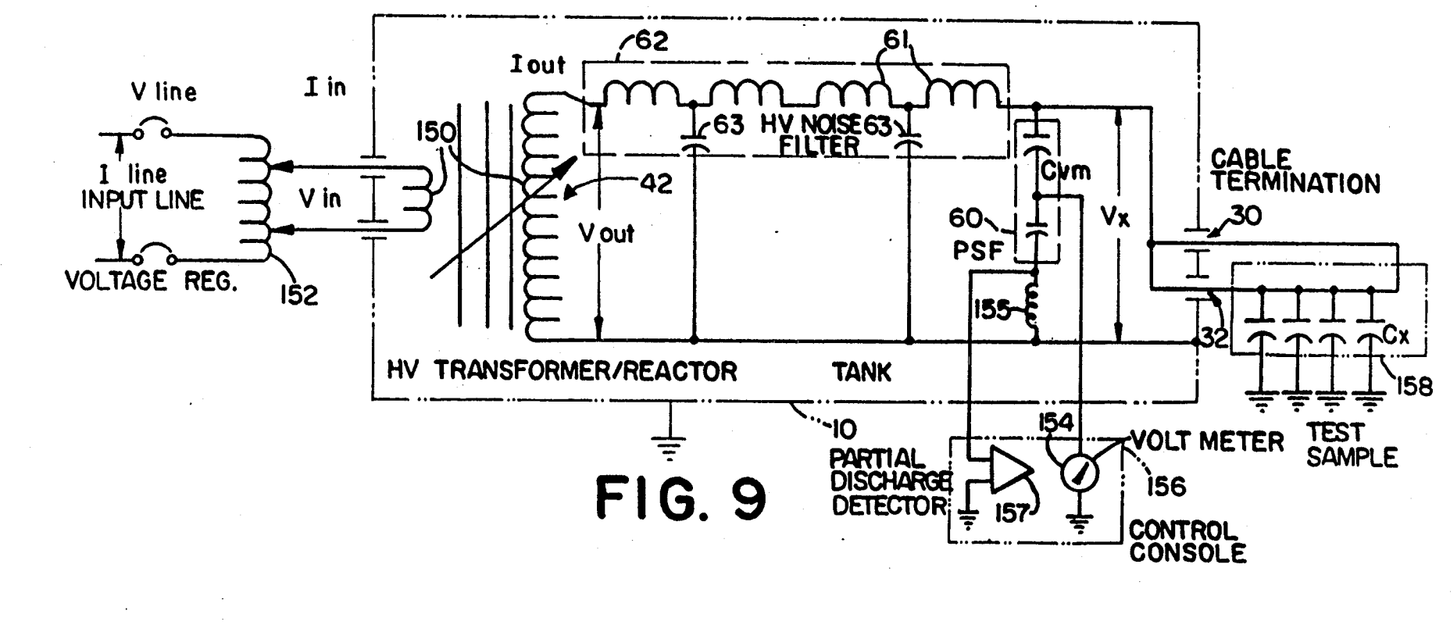
FIG. 9 is a circuit diagram of the circuit used with the system of FIGS. 1-3.

The circuitry used in the test systems of the present invention is in general conventional, but may be simply described. FIG. 9 shows circuitry for use in the systems of FIGS. 1 to 3. In that system the high voltage reactor 42 is connected in a parallel resonant circuit of the high voltage filter 62 which includes capacitors 63 and inductors 61. The reactor 42 is incorporated as the secondary of high voltage transformer 150. Power input is supplied through appropriate low potential bushings from voltage regulator 152 from a power source, not shown. Supplying a current $I_{in}$ at a voltage $V_{in}$ input to the transformer 150 produces an output across the secondary of $I_{out}$ at a voltage $V_{out}$. The output passes the power separation filter 60 which provides an output measurement at proportionally stepped down voltage to a voltmeter 154 and a signal to the partial discharge detector 157 both in a control console 156. The voltage is applied to the cable termination bushings 30 and 32. The axial conductor of each end of the cable is subjected to the same voltage $V_x$ and its conductive cable cover 120 is connected to ground providing a capacitance load 158 through the cable insulation.

Figure 10:
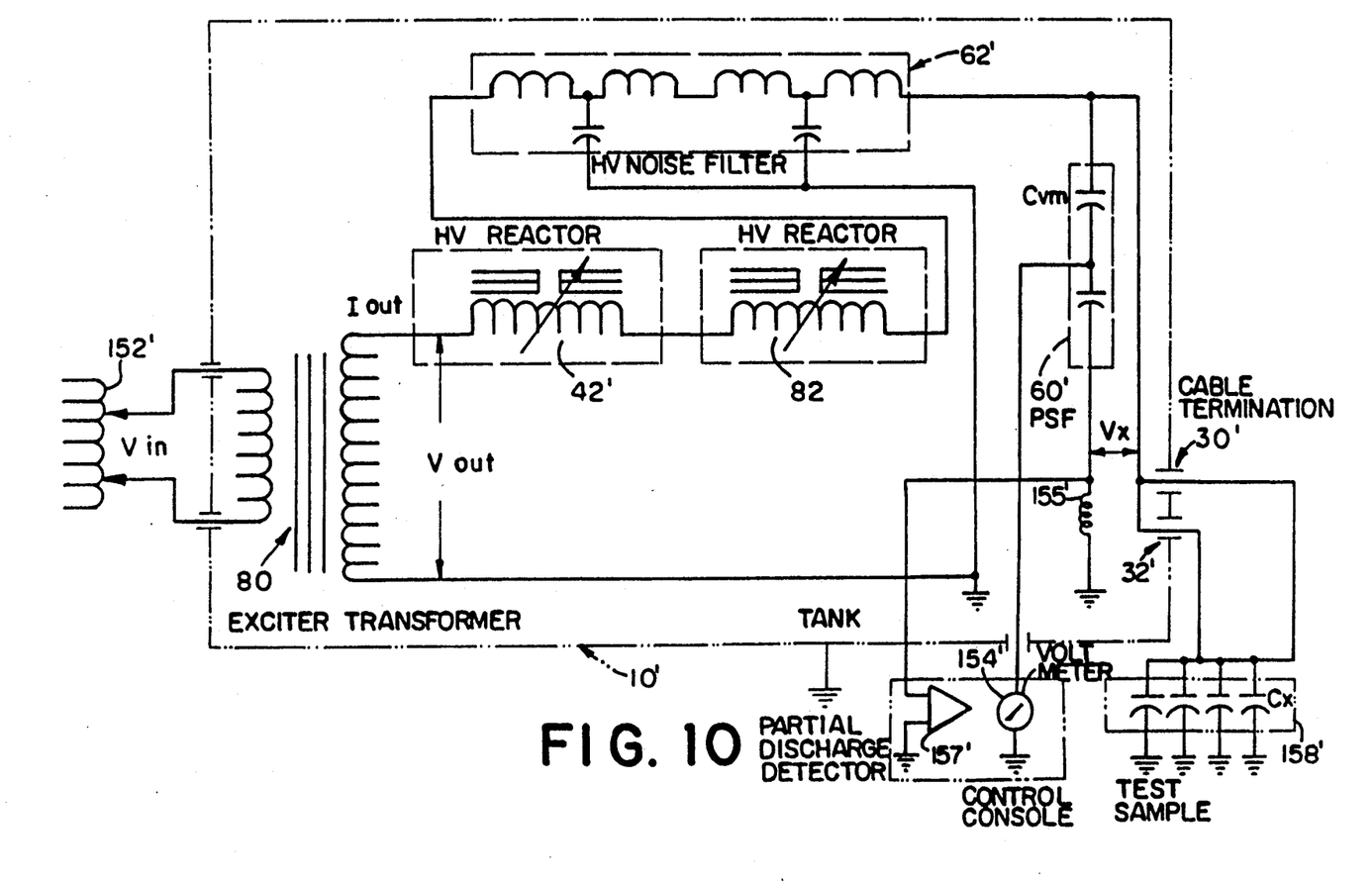
FIG. 10 is a circuit diagram of the circuit used with the system of FIGS. 4 and 5.

The circuitry employed in the circuitry used with the FIG. 4 and 5 construction is shown in FIG. 10 and this is a series resonant system. In this case a voltage regulator 152' provides selected current $I_{in}$ at voltage $V_{in}$ to the primary of the exciter transformer 80. One side of the secondary of the transformer is connected to ground as is the tank 10' and the other side is maintained at voltage output $V_{out}$ and provides a current $I_{out}$. The first of the high voltage reactors 42' is connected to the high voltage side of the exciter secondary and its output, in turn, is connected to the second stage high voltage reactor 82. The power separation filter 60' provides an output to volt meter 154' and a signal to the partial discharge detector 157' both in control console 156'. The output voltage $V_x$ is applied to the cable terminations 30' and 32' and the conductive cover of the cable is connected to ground providing the cable insulator $C_x$ as a test sample.

Figures 11, 12, 13:
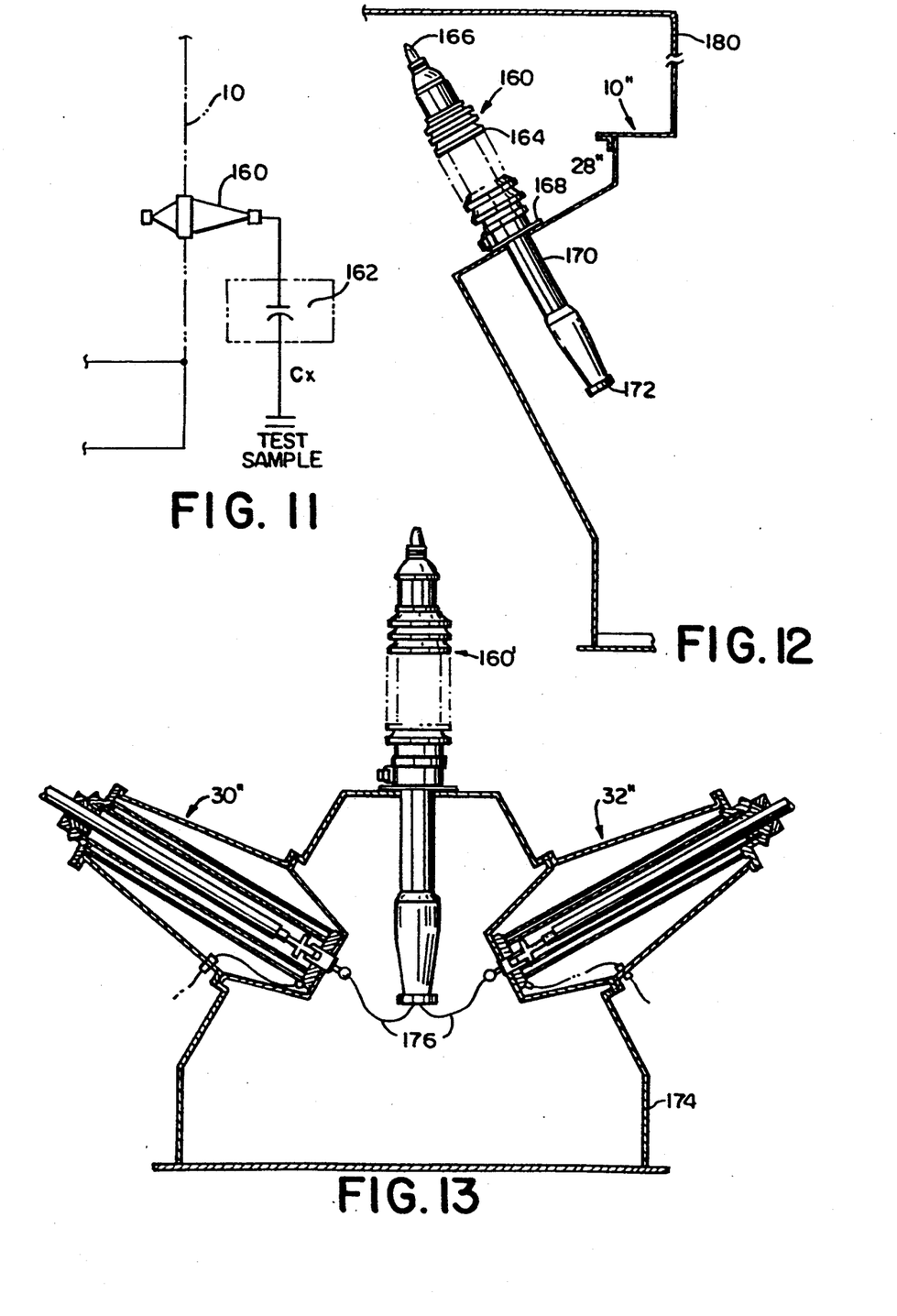
FIG. 11 shows the alternative circuit termination for either FIG. 9 or 10 when a high voltage bushing is substituted for the cable termination of FIGS. 9 and 10.
FIG. 12 shows a high voltage bushing substituted for the cable termination in either of the tanks of FIG. 1 or 4.
FIG. 13 shows a stand alone tank simply for the purpose of connecting high voltage brought into the tank by a bushing to a cable connectable by the cable termination of FIG. 7.

It is possible using either the circuit of FIG. 9 or 10 to employ some other insulator test sample $C_x$ than a cable. The schematic showing of such a circuit termination is shown in FIG. 11. Instead of employing cable termination bushings 30, 32 or 30' 32' for testing cables for which there must be two such bushings provided to accommodate both ends of the cable, a single output bushing 160 is brought out of the tank 10 to accommodate the test sample 162. Such an output bushing is shown physically in FIG. 12 wherein the partial representation shown is made in substitution of the end of in the tank 10''. The bushing 160 extends through the extension 28'' of that tank. The bushing 160 is conventional in all respects and employs insulators 164 surrounding a central rod conductor 166. A suitable sealing coupling 168 supported on the outside of the tank 10 supports the conductor which passes through an opening in the extension 28. An insulator means 170 surrounding the conductor rod within the tank terminates in a conductive plate 172 connected to coaxial rod 166. Plate 172 provides a terminal for connection to the circuit elements within the tank.

The cable connectors can also be used in other installations in which the sole purpose is to connect a high potential from some undesignated source to a cable for testing. As seen in FIG. 13 a smaller oil fill tank 174 may have a similar type bushing 160' connected to a high voltage line and bringing high voltage into the oil filled tank 174. Within the tank connections 176 are made to the conductor of cable connecting bushings 30'' and 32'' shown in FIG. 7 and cables 38'' and 40'' are terminated in cable terminations similar to those shown in FIG. 8. It will be appreciated that a single input bushing 160 puts the high voltage into the oil filled tank and allows connection to the high voltage terminals within the bushings 30'' and 32'', both of which are needed to connect the cable to be tested. It is possible to have multiple cable connectors so that when more than one cable may be tested at a time, if desired, but the arrangement of such connectors relative to one another is a matter of choice and therefore it has not been illustrated.

It will be appreciated by those skilled in the art that in some sensitive situations it will be desirable to have a shielded enclosure of much smaller size surrounding the high voltage output of a given tank test set. This is particularly desirable when cable connector bushings are not employed but a conventional bushing such as 160 shown in FIG. 12 or 160' shown in FIG. 13 are used. As shown in FIG. 12, shielded housing 180, which is only partially illustrated, is provided to enclose the end of the tank with the exposed bushing and provide working room for performing and setting up tests.

Various embodiments of the present invention have been illustrated. Modifications of those embodiments and related structures will occur to those skilled in the art. All such modifications within the scope of the claims are intended to be within the scope and spirit of the present invention.

I claim:

1. In combination with a conductive tank at ground potential filled with an insulating medium such as oil, capable of rejecting non-system EMI and RFI signals, in which components in a high voltage circuit are enclosed, a bushing allowing a coaxial high voltage cable being texted to be conductively connected through the tank wall to the high voltage circuit comprising:

an insulator barrier wall extending into the tank from a sidewall of the tank surrounding an opening in the tank wall;

a high voltage conductive member extending through the insulator barrier wall remote from the wall of the tank to which the circuitry of the components within the tank is coupled and providing a quick coupling for a cooperating coaxial high voltage cable conductor termination;

a tubular metallic bushing member conductively affixed to the tank wall around the opening and extending away from the housing and from the insulator barrier wall;

an insulating tubular member extending from within the tubular metallic bushing member to the region of the high voltage conductive member;

a structure terminating the metallic bushing member with means connecting the metallic bushing member and the insulating tubular member; and means connecting the insulating tubular member to the high voltage conductive member spaced from the insulator barrier wall.

2. The cable testing device of claim 1 in which hose connections and fittings are provided through the bushing to opposite ends of the structure to provide deionized water to the tubular area within the insulating tubular member and surrounding a terminated cable within the bushing.

3. A bushing for connecting high voltage components and circuitry contained in an oil-filled metallic tank to a cable whose end has been specially prepared for connection through the bushing comprising:

an insulator barrier wall extending into the tank from a sidewall of the tank surrounding an opening in the tank wall;

a high voltage conductive member extending through the insulator barrier wall remote from the wall of the tank to which the circuitry of the components within the tank is coupled and providing a quick coupling for a cooperating coaxial high voltage cable conductor termination;

a tubular metallic bushing member conductively affixed to the tank wall around the opening and extending away from the housing and from the insulator barrier wall;

an insulating tubular member extending from within the tubular metallic bushing member to the region of the high voltage conductive member;

a structure terminating the metallic bushing member with means connecting the metallic bushing member to the insulating tubular member; and means connecting the insulating tubular member to the high voltage conductive member spaced from the insulator barrier wall.

4. The high voltage test set of claim 3 in which the insulator barrier wall extending into the tank is a frustoconical cup member and the high voltage connector is a coaxial member; the tubular metallic bushing member conductively fixed to the tank wall is a frustoconical piece tapering from a large diameter surrounding the opening in the tank to a narrow diameter dictated by cable size, a conductive ring wall extends inwardly and connects the narrow end of the conductive frustoconical member to the inner insulating tubular member, a further ring wall extends outwardly from the high voltage conductor to the inner insulating tubular member and spaced from the bottom of the insulating barrier member cup, and both of which ring members provide support for the inner insulating tubular member with the tubular member arranged coaxially with the conductor so that the tubular member acts as a guide for a cable termination and each of which ring members provides passage connectable to lines outside the bushing for the introduction of the demineralized water into the space within the insulating tubular member.

5. The test set of claim 4 in which the cable termination provides a seal in cooperation with the bushing which keeps the dionized water in the space between the cable and the uniform tubular member.

6. The test set of claim 4 in which means is provided on the ring wall terminating the tubular metal bushing housing enabling the prepared cable to be clamped and sealed in place.

* * * * *